(12) United States Patent
Compaan et al.

(10) Patent No.: US 6,852,614 B1
(45) Date of Patent: Feb. 8, 2005

(54) METHOD OF MANUFACTURING SEMICONDUCTOR HAVING GROUP II-GROUP VI COMPOUNDS DOPED WITH NITROGEN

(75) Inventors: Alvin D. Compaan, Sylvania, OH (US); Kent J. Price, Toledo, OH (US); Xianda Ma, Milpitas, CA (US); Konstantin Makhratchev, Fremont, CA (US)

(73) Assignee: University of Maine, Toledo, OH (US)

( * ) Notice: Subject to any disclaimer, the term of this patent is extended or adjusted under 35 U.S.C. 154(b) by 108 days.

(21) Appl. No.: 09/815,958

(22) Filed: Mar. 23, 2001

Related U.S. Application Data
(60) Provisional application No. 60/192,005, filed on Mar. 24, 2000.

(51) Int. Cl.[7] .............................................. H01L 21/28
(52) U.S. Cl. ....................................... 438/603; 438/602
(58) Field of Search .............................. 438/94, 95–99, 438/488, 630, 602–604

(56) References Cited

U.S. PATENT DOCUMENTS

| | | | |
|---|---|---|---|
| 4,064,522 A | * 12/1977 | Shaw et al. ................. | 136/260 |
| 5,304,499 A | * 4/1994 | Bonnet et al. ................ | 438/94 |
| 5,393,675 A | 2/1995 | Compaan | |
| 5,578,501 A | * 11/1996 | Niwa ........................... | 438/98 |
| 5,635,310 A | * 6/1997 | Kudo et al. ............ | 428/694 TS |
| 5,786,269 A | * 7/1998 | Murakami et al. .......... | 438/603 |
| 5,909,632 A | 6/1999 | Gessert | |
| 6,113,691 A | * 9/2000 | Taskar et al. ................ | 117/104 |

OTHER PUBLICATIONS

Article entitled Heavy p–doping of Zn Te by molecular beam epitaxy using a nitrogen plasma source, Appl. Phys. Lett. 62 (8), Feb. 22, 1993, Copyright 1993 American Institue of Physics.

* cited by examiner

Primary Examiner—Dung A. Le
(74) Attorney, Agent, or Firm—MacMillan, Sobanski & Todd, LLC

(57) ABSTRACT

A method of making a semiconductor comprises depositing a group II–group VI compound onto a substrate in the presence of nitrogen using sputtering to produce a nitrogen-doped semiconductor. This method can be used for making a photovoltaic cell using sputtering to apply a back contact layer of group II–group VI compound to a substrate in the presence of nitrogen, the back coating layer being doped with nitrogen. A semiconductor comprising a group II–group VI compound doped with nitrogen, and a photovoltaic cell comprising a substrate on which is deposited a layer of a group II–group VI compound doped with nitrogen, are also included.

21 Claims, 2 Drawing Sheets

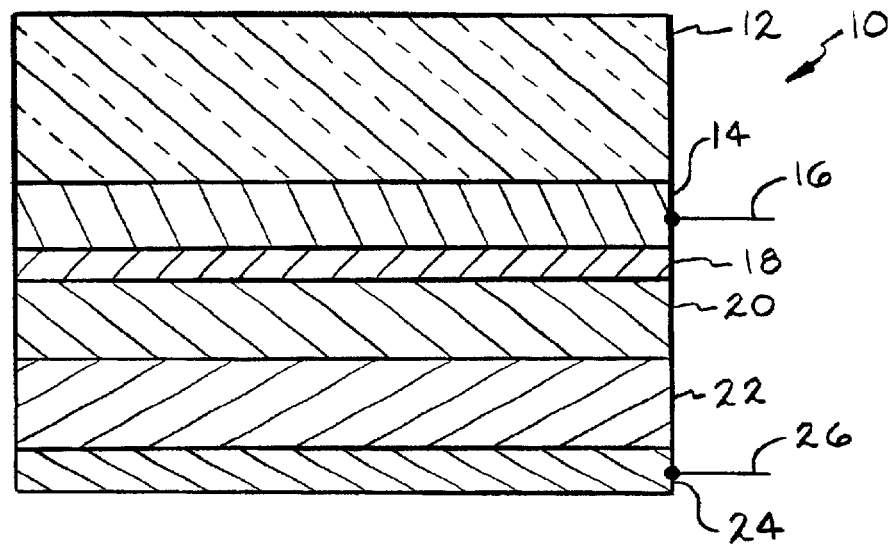
FIG. 1
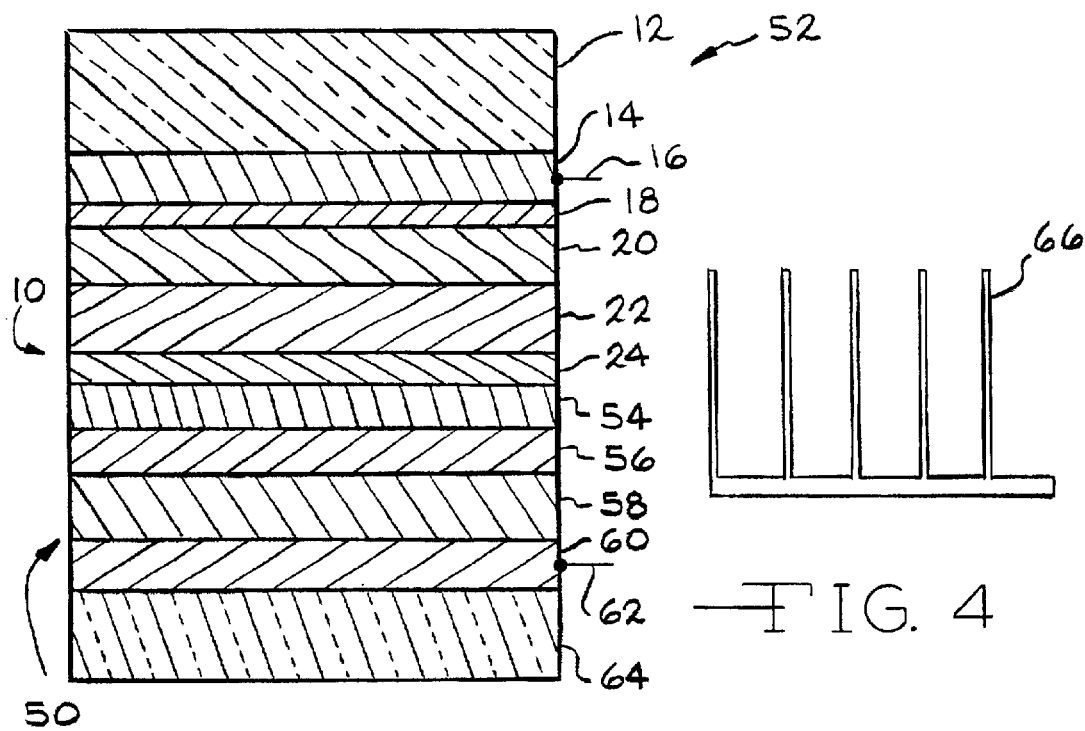
FIG. 3
FIG. 4

US 6,852,614 B1

METHOD OF MANUFACTURING SEMICONDUCTOR HAVING GROUP II-GROUP VI COMPOUNDS DOPED WITH NITROGEN

CROSS-REFERENCE TO RELATED APPLICATIONS

Application claims the benefit of U.S. Provisional Application Ser. No. 60/192,005, filed Mar. 24, 2000.

GOVERNMENT INTERESTS

The United States Government has certain rights in this invention pursuant to Contract No. NERL-ZAF-8-17619-14 awarded by the U.S. Department of Energy.

TECHNICAL FIELD

The present invention concerns semiconductor materials and methods of manufacturing semiconductor materials. More particularly, this invention relates to manufacturing semiconductor materials that are doped for improved formation of mobile charge carriers, particularly for such uses as in photovoltaic cells.

BACKGROUND OF THE INVENTION

It is well known that solar cells or photovoltaic cells can be used to convert solar energy into electric current. Typical photovoltaic cells include a substrate for mounting the cell and two ohmic contacts or conductors for passing current to an external electrical circuit. The cell also includes two or three semiconductor layers in series. The two layer type of semiconductor cell consists of an n-type layer and a p-type layer, and the three layer type includes an intrinsic (i-type) layer positioned between the n-type layer and the p-type layer for absorption of light radiation. The operate by having readily excitable electrons that can be energized by solar energy to higher energy levels, thereby creating positively charged holes and negatively charged electrons at the interface of various semiconductor layers. The creation of these positive and negative charge carriers applies a net voltage across two electrode layers in the photovoltaic cell, establishing a current of electricity.

The semiconductor layers may be formed from single crystalline materials, amorphous materials, or polycrystalline materials. Single crystalline layers are often made with a molecular beam epitaxy (MBE) process (or other vapor deposition process), but the largest area of a substrate that can be practically covered using such processes is on the order of several square centimeters because it is limited by the size tri of single crystal substrates, which is an impractical size when considering the surface area required for economically practical solar cells. Therefore, although single crystal photovoltaic materials can be used to generate conversion efficiencies over 20 percent, they have significant drawbacks because of their high manufactured cost. Accordingly, where the solar cell must compete with conventional electricity generation by nuclear or fossil fuel, polycrystalline materials are viewed as the material of choice for the production of semiconductors and solar cells using such semiconductors. Typically, the polycrystalline material of choice for a semiconductor in a photovoltaic cell is a group II–group VI compound, such as cadmium telluride. Cadmium telluride is preferred for thin film photovoltaic applications because of its direct band gap and its ability to be doped n-type and p-type, which permits formation of a variety of junction structures. It is known that an RF sputtering technique can be used to deposit thin films of cadmium telluride onto substrates for use in photovoltaic cells, as disclosed in U.S. Pat. No. 5,393,675 to Compaan. The RF sputtering technique can also be used for depositing other thin group II–group VI semiconductor films such as cadmium sulfide and zinc telluride for use in a photovoltaic cell. RF sputtering involves positioning a substrate in a pressure chamber and operating a magnetron sputtering gun. The gun includes a target (the cathode) of pressed and sintered cadmium sulfide or cadmium telluride typically prepared from powder. The substrate is positioned behind the target and is coated as the target is bombarded. The process takes place typically in an inert atmosphere of argon gas.

In most photovoltaic cells it is necessary to dope one or more semiconductor layers to be highly conductive to achieve easy flow of electrons and holes into the respective contact electrodes. Particularly for cadmium telluride and zinc telluride and related semiconductors, copper is often used for this dopant. While the doping with copper is successful in obtaining the desired conductivity, the use of copper has its limitations. It has been found that over time the copper diffuses into other semiconductor layers of the photovoltaic cell, thereby causing a loss in efficiency. When copper is used to dope a zinc telluride contacting layer the copper tends to move into the cadmium telluride layer and even penetrate into the cadmium sulfide/cadmium telluride junction where it degrades the photovoltaic activity. Further, when zinc telluride and other semiconductors are heavily doped with copper, the semiconductor layer begins to lose its transparency to radiation transmission.

There remains a continuing need for a more efficient and less expensive photovoltaic cell. It would be advantageous if there could be developed a contacting layer material suitable for solar cells, where the material minimizes or eliminates the problem of diffusion of copper into other layers of the cell. Further, it would be helpful if such a contacting layer could be transparent to solar energy in wavelengths that are not absorbed by the upper semiconductor layers such as cadmium sulfide and cadmium telluride so that capture of additional energy could be made in a second solar cell underneath the top solar cell.

SUMMARY OF THE INVENTION

The above objects as well as other objects not specifically enumerated are achieved by a method of making a semiconductor comprising depositing a group II–group VI compound onto a substrate in the presence of nitrogen using sputtering to produce a nitrogen-doped semiconductor.

According to another embodiment of the invention, there is provided a method of making a photovoltaic cell comprising using sputtering to apply a back contact layer of group II–group VI compound to a substrate in the presence of nitrogen, the back coating layer being doped with nitrogen.

According to another embodiment of the invention, there is provided a semiconductor comprising a group II–group VI compound doped with nitrogen.

According to another embodiment of the invention, there is provided a photovoltaic cell comprising a substrate on which is deposited a layer of a group II–group VI compound doped with nitrogen.

Various objects and advantages of this invention will become apparent to those skilled in the art from the following detailed description of the preferred embodiment, when read in light of the accompanying drawings.

BRIEF DESCRIPTION OF THE DRAWINGS

FIG. 1 is a schematic elevational view of a photovoltaic cell according to the present invention.

FIG. 3 is a schematic elevational view of another embodiment of the invention where the photovoltaic cell of the invention is assembled with a second photovoltaic cell for absorbing infrared solar radiation.

FIG. 4 is a schematic plan view of the conductive grid that forms the lowermost layer of the first photovoltaic cell and uppermost layer of the second photovoltaic cell in a 4-terminal tandem combination of photovoltaic cells of the invention.

DETAILED DESCRIPTION OF THE INVENTION

Figure 2:
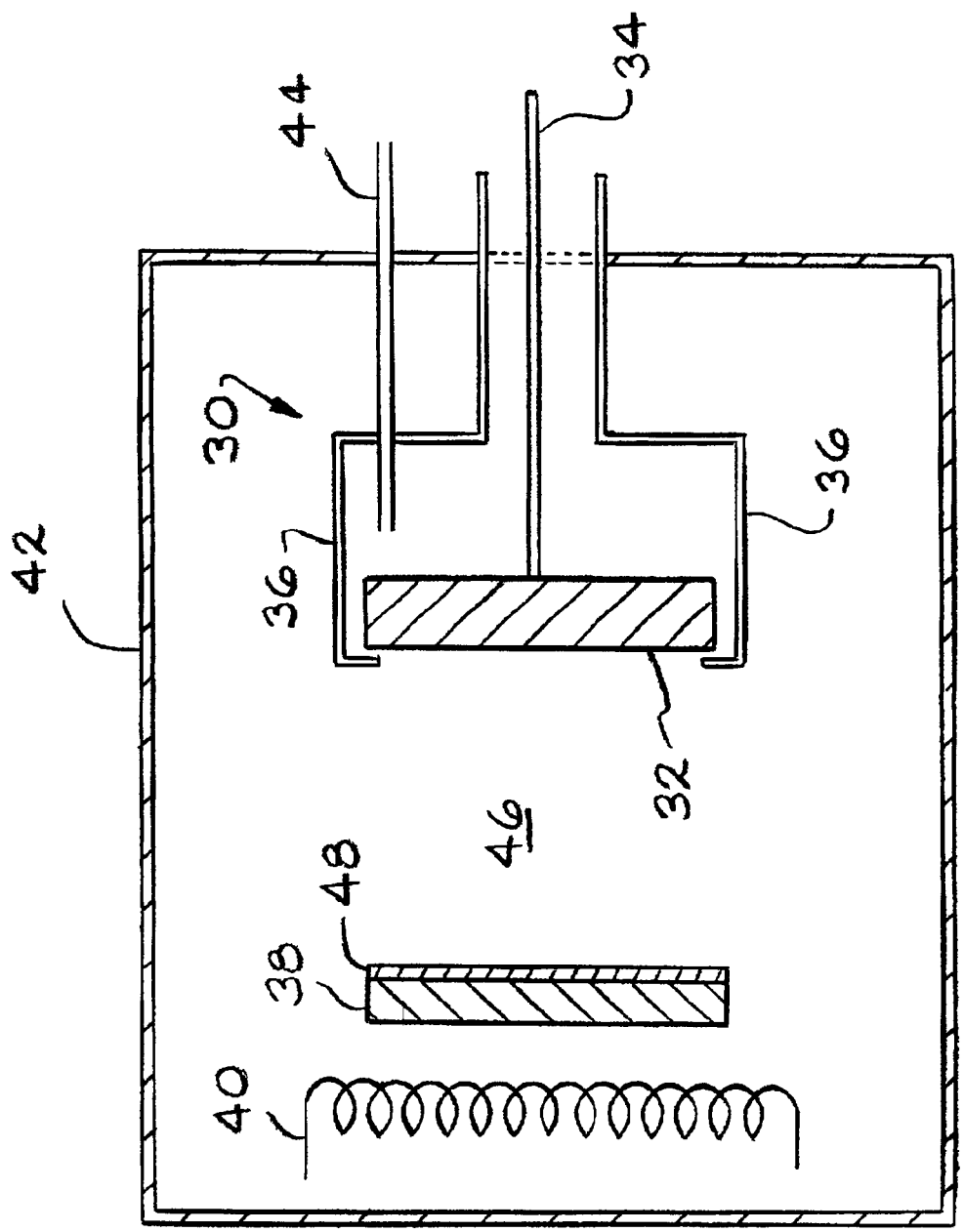
FIG. 2 is a schematic plan view of a sputtering apparatus according the present invention.

As shown in FIG. 1, the photovoltaic cell of the invention is indicated generally at 10. The photovoltaic cell 10 includes a substrate 12. Preferably this substrate is a glass layer, but other transparent materials for the substrate can be used. A layer of a transparent conductive material such as a transparent conductive oxide 14, is applied to the glass layer 12. In a preferred embodiment, this transparent conductive oxide is tin oxide ($SnO_2$), and more preferably the tin oxide is doped with fluorine ($SnO_2$:F). This layer forms one of the two ohmic contacts or electrodes for the photovoltaic cell 10, and contains a conductive lead 16 for conducting current through an electric circuit, not shown. Alternative materials for this transparent conductive oxide layer include cadmium stannous oxide ($Cd_2SnO_4$).

The first of two primary semiconductor layers is n-type semiconductor layer 18. In a preferred embodiment of the invention this n-type semiconductor is cadmium sulfide (CdS). The next major semiconductor layer is a p-type semiconductor 20, which is preferably cadmium telluride (CdTe). Numerous other semiconductor layers can be used for these two primary semiconductors. It is to be understood that an intrinsic semiconductor layer, not shown, can be disposed between the p-type semiconductor layer and the n-type semiconductor layer in conjunction with the present invention. A layer of back contact material is indicated at 22. The back contact layer 22 acts to provide an interface with conductive layer 24, which is the second of the two ohmic contacts or electrodes for the photovoltaic cell 10. The conductive layer 24 contains a conductive lead 26 for conducting current through the electric circuit, not shown. Typically, the conductive electrode layer is made of nickel, titanium, chromium, aluminum, or some other conductive material. An additional protective or buffer layer of zinc telluride, not shown, can be positioned between the back contact layer 22 and the cadmium telluride semiconductor layer 20 to protect the cadmium telluride layer from foreign contamination by migration, but such a layer has been found to be unnecessary in the present embodiment.

During operation of the photovoltaic cell 10, light in the visible spectrum incident on the glass layer 12 travels as far as the cadmium telluride layer 20, where the light is largely absorbed. The field created at the cadmium sulfide/cadmium telluride junction causes a voltage to be applied across the two conductive layers 14 and 24, thereby causing a current to flow through the circuit.

In the preferred embodiment of the invention the back contact material 22 is zinc telluride doped with nitrogen (ZnTe:N). Numerous other group II–group VI compounds, when doped with nitrogen, can be used with the invention. Examples include zinc selenide, zinc sulfide, mercury selenide, mercury telluride, mercury is sulfide, cadmium sulfide, cadmium telluride, cadmium selenide, magnesium telluride, and magnesium selenide. It is to be understood that these compounds can be used alone or in combination with each other. Such combinations can be in the form of alloys. Therefore, the term "depositing a group II–group VI compound" includes depositing one or more group II–group VI compounds, or an alloy of more than one group II–group VI compound.

The doping of the back contact layer 22 with nitrogen provides charge carriers for effective charge conduction from the primary semiconductors 18 and 20 to the conductive electrode layer 24. In many ways the nitrogen doped back contact 22 behaves as would be expected for a back contact material doped with metals such as copper. However in several important ways, as will be explained below, the nitrogen doped group II–group VI compounds provide a performance superior to conventional, metal doped compounds. When tested, it was found that the semiconductor of the invention has a carrier concentration greater than about $5 \times 10^{18}$/cc and a resistivity less than about 10 ohm-cm. In some cases the resistivity is lower than 5 ohm-cm, and can be as low as 1 ohm-cm. It is expected that the conversion efficiency of photovoltaic cells of the invention will be greater than 10 percent. Conversion efficiency is the amount of electric energy produced as a percentage of the incident solar energy.

While the semiconductor of the invention is very useful when incorporated in a photovoltaic cell, there are other uses for the nitrogen doped group II–group VI compounds. For example, the semiconductor of the invention can be used in combination with a large-area flat panel light emitting display, wherein the nitrogen-doped group II–group VI compound forms a p-type heavily doped layer of a light emitting diode.

Apparatus for performing the preferred method of making the semiconductor layer 22 according to the invention is illustrated in FIG. 2. A radio frequency (RF) reactive sputtering process is preferably used. A disclosure of such a process is contained in U.S. Pat. No. 5,393,675 to Compaan, which is hereby incorporated by reference in its entirety. As shown in FIG. 2, a magnetron sputter gun is indicated generally at 30. The sputter gun 30 includes a sputter target or cathode 32 that is positioned to receive RF power from an RF generator, not shown, by means of conductor 34. The sputter anode is indicated at 36. The material in the target 32 is pressed and sintered cadmium sulfide or cadmium telluride prepared from powder. Behind the target is the substrate 38, which is heated by a heater 40. The sputter gas, argon, is introduced into the chamber 42 through inlet pipe 44.

Operation of the magnetron sputter gun 30 creates a plasma region indicated at 46. Ionized atoms of the sputter gas, argon, are driven into the target 32 causing backward sputtering of the target atoms onto the heated substrate 38 to form the back contact layer. It is to be understood that several semiconductor layers will have been deposited on the substrate prior to deposition of the back contact layer. The proper background gas must be present in the chamber 42 to facilitate the formation of a sputtering plasma. The sputtering system uses an atmosphere of gas having heavy ions, such as argon at a low pressure that is typically within the range of from about 1 to about 50 milli-Torrs. Typical thicknesses of the semiconductor layer 48 deposited by this sputtering process is on the order of between 0.1 and 3.0 microns, depending on such factors as the sputtering time, RF power and gas pressure. After deposition of all of the semiconductor layers, the cell 10 can be annealed. Also, the cell is in preferably washed with a dilute hydrochloric acid solution.

In order to achieve the nitrogen doping of the semiconductor layer 48, nitrogen 337 is also introduced into the chamber 42 in the form of gaseous nitrogen. It is possible that the action of the sputtering plasma splits the nitrogen molecule into elemental nitrogen. Regardless of the mechanism, a portion of the nitrogen is incorporated into the semiconductor layer 48 on the substrate 38. The preferred process is a reactive process, which means that atoms or molecules from the vapor combine with sputtered atoms in the deposited film. Usually the vapor species are activated by the plasma.

The amount of nitrogen in the gaseous atmosphere within the chamber 42, as a percentage of the argon gas, is preferably within the range of from about 0.5 to about 3 percent, and more preferably within the range of from about 1 to about 2.5 percent, although other percentages of nitrogen in the atmosphere can be used. While it is preferred to introduce the nitrogen into the deposited semiconductor layer beginning with the nitrogen in gaseous form, it is to be understood that the nitrogen can be incorporated into the target 32 as part of the solid target materials, and introduced using the sputtering technique.

One of the advantages of the sputtering technique of the invention over alternative doped semiconductor making processes is that the sputtering technique can be used to make large sized layers of semiconductor materials. The alternative molecular beam epitaxy process technique, for example, is limited to a maximum size on the order of about several square centimeters. In contrast, the sputtering method of the invention is capable of making semiconductor layers of much larger sizes, including layers that are larger than about 4 $cm^2$, at least as large as about 10 $cm^2$, and preferably as large as or even larger than a square meter.

The first area in which the nitrogen doped semiconductor has superior properties over conventional semiconductor or back contact materials is that there is no need to have the semiconductor materials doped with copper. This is greatly advantageous since the problem of migration of the copper ions into the primary semiconductor layers 18 and 20 is eliminated. In fact, except for generally unavoidable small residues of copper in the cadmium sulfide and cadmium telluride primary semiconductor layers 18 and 20, the photovoltaic cell 10 is copper free. For purposes of this invention, the term copper free means less than about 0.01 percent copper.

The second area in which the nitrogen doped back contact semiconductor has superior properties over conventional semiconductor or back contact materials is that the semiconductor layer 22 is more transparent than conventional copper-doped semiconductor layers. For example, it has been found that a nitrogen-doped zinc telluride back contact layer maintains an excellent transparency to solar radiation at wavelengths above 700 nm. As a generalization for different group II–group VI compounds of the invention, the semiconductor is transparent at photon energies less than the band gap of the semiconductor. This property of improved transparency for the nitrogen-doped back contact material allows the photovoltaic cell 10 to be placed in tandem with an additional solar cell for absorption of more energy from the sun. The additional solar cell or photovoltaic cell can be any suitable type of additional cell, such as a conventional silicon solar cell.

As shown in FIGS. 3 and 4, a photovoltaic cell 10 is assembled together with an additional or second photovoltaic cell 50 to form a combined or tandem 2-terminal cell arrangement indicated generally at 52. The second photovoltaic cell 50 is designed to absorb infrared solar radiation. In one example, the second photovoltaic cell 50 includes a zinc oxide transparent conductor layer 54, which is preferably doped with aluminum (ZnO:Al). An n-type cadmium sulfide semiconductor layer 56, and a p-type copper indium diselenide ($CuInSe_2$) semiconductor layer 58 form an n-p junction within the second cell 50. A final electrode 60 of a conductive material, such as La molybdenum, includes a conductive lead 62 for conducting current through the electric circuit. The last layer is a glass layer 64, which acts as a substrate.

At the boundary between the two tandem cells 10 and 50 a tunnel junction is formed, and specifically this junction is between the nitrogen doped zinc telluride (ZnTe:N) layer 22 of cell 10 and the zinc oxide layer 54 of the cell 50. As is well known, a tunnel junction provides for quantum mechanical tunneling between the two semiconductors.

The tandem arrangement shown in FIG. 3 is a 2-terminal tandem arrangement, having conductive leads 16 and 64 leading to the electric circuit. As an alternative arrangement, the tandem cell assembly 52 can be configured as a 4-terminal tandem arrangement. In that case, additional conductive leads, not shown, would be connected to the conductive layers 24 and 54, thereby resulting in two separate circuits, also not shown. The advantage of the 4-terminal system with two separate circuits is that the current from the two cells would not be required to match and no electrical or physical contact is needed between cell 10 and cell 50. Where a 4-terminal system is used, there must be a conductive grid in layer 24 and in layer 54, but these connectors must be substantially transparent to light. A preferred conductive grid 66 for this purpose is shown in FIG. 4.

EXAMPLE I

RF Sputtering was used to make a layer of nitrogen-doped zinc telluride in a solar cell. The reactive RF sputtering was carried out in a chamber assembled from a six-way stainless steel, copper gasketed cross with a two-inch planar magnetron mounted horizontally in one arm. The magnetron used an unbalanced magnetic field configuration. The substrate was suspended at the center of the cross about 2.5 inches from the sputter target in a heater assembly which provided radiant heating of the glass or tin dioxide ($SnO_2$)-coated glass substrates. The preferred substrate temperature is within the range of from about 300 to about 400 degrees C. The gas flow, controlled by two parallel mass flow controllers, entered from another arm of the cross approximately in the plane of the substrate, although the gas injection can be made at the magnetron between the ground shroud (anode) and the target (cathode). In this example, the cadmium sulfide and cadmium telluride were previously deposited by a vapor transport deposition process. The zinc telluride contacts were applied to the vapor transport deposition layers directly after the standard wet cadmium chloride treatment. In this example RF sputtering was used to deposit an intrinsic zinc telluride layer that was 30 nm thick, and this was followed by the nitrogen-doped zinc telluride layer that was about 80 nm thick. The nitrogen doped zinc telluride layer was covered by nickel that was direct current sputtered through a mask to define cells having an area of approximately 0.18 $cm^2$. After the nickel deposition, the cells were heat treated in air at 200 degrees C. for 30 minutes.

EXAMPLE II

The solar cell produced in Example I was tested for conversion efficiency, defined as the amount of electric energy produced as a percentage of the incident solar energy. When tested for conversion efficiency, the result was a conversion efficiency, of about 10 percent, when measured using an air mass 1.5 solar simulator.

EXAMPLE III

The solar cell produced in Example I was tested for stability of the conversion efficiency. Two tests were conducted. For the first test, a set of solar cells was subjected to solar energy equivalent in intensity to the illumination provided by the sun, i.e., one-sun illumination, for a 24 hour per day, 125 day continuous exposure period, i.e., approximately 3,000 hours. The lamp used was a metal halide discharge lamp. The test was conducted under open circuit conditions at approximately 65 degrees C., with no current drawn from the cell. The test showed that the efficiency decreased about 15% over the first 1000 hours but then was stable. For the second test, a set of cells was subjected to heating at 100 degrees C. continuously in the dark for 3,000 hours. Again the efficiency dropped less than 15% during the first 1000 hours and then was stable. Similar cells with copper-based contacts lost half or more of their efficiency over this 3000 hour test. It can be seen that the efficiency changed by less than 20 percent in each of the tests.

The principle and mode of operation of this invention have been described in its preferred embodiments. However, it should be noted that this invention may be practiced otherwise than as specifically illustrated and described without departing from its scope.

What is claimed is:

1. A method of making a semiconductor comprising depositing a group II–group VI compound onto a substrate in the presence of nitrogen in a gaseous form using sputtering to produce a nitrogen-doped p-type semiconductor.

2. The method of claim 1 in which the group II–group VI compound is one or more compounds of the group zinc telluride, zinc selenide, zinc sulfide, mercury selenide, mercury telluride, mercury sulfide, cadmium sulfide, cadmium telluride, cadmium selenide, magnesium-telluride, and magnesium selenide.

3. The method of claim 1 in which the sputtering is RP sputtering.

4. The method of claim 1 in which the sputtering is reactive sputtering.

5. The method of claim 1 in which sputtering stp creates a layer of the doped group II–group VI compound that is larger than about 4 cm$^2$.

6. The method of claim 1 in which the group II–group VI compound is zinc telluride.

7. A method of making a photovoltaic cell comprising using sputtering to apply a p-type back contact layer of group II–group VI compound to a substrate in the presence of nitrogen in a gaseous forms the back coating layer being doped with nitrogen.

8. The method of claim 7 in which the group II–group VI compound is one or more compounds of the group zinc telluride, zinc selenide, zinc sulfide, mercury selenide, mercury telluride, mercury sulfide, cadmium sulfide, cadmium telluride, cadmium selenide, magnesium telluride, and magnesium selenide.

9. The method of claim 7 in which the sputtering is RF sputtering.

10. The method of claim 7 in which the sputtering is reactive sputtering.

11. The method of claim 7 in which sputtering step creates a layer of the doped group II–group VI compound that is larger than about 4 cm$^2$.

12. The method of claim 7 in which the group II–group VI compound is zinc telluride.

13. A method of making a semiconductor comprising depositing a group II–group VI compound onto a substrate using sputtering to produce a nitrogen-doped p-type semiconductor, wherein the sputtering is carried out in an atmosphere containing an amount of nitrogen in a gaseous form within the range of from about 0.5 percent to about 3 percent.

14. The method of claim 13 in which the remainder of the atmosphere is argon gas.

15. The method of claim 13 in which the group II–group VI compound is one or more compounds of the group zinc telluride, zinc selenide, zinc sulfide, mercury selenide, mercury telluride, mercury sulfide, cadmium sulfide, cadmium telluride, cadmium selenide, magnesium telluride, and magnesium selenide.

16. The method of claim 13 in which the group II–group VI compound is zinc telluride.

17. A method of making a photovoltaic cell comprising using sputtering to apply a back contact p-type layer of group II–group VI compound to a substrate in the presence of nitrogen, the back coating layer being doped with nitrogen, wherein the sputtering is carried out in an atmosphere containing an amount of nitrogen in a gaseous form within the range of from about 0.5 percent to about 3 percent.

18. The method of claim 17 in which the remainder of the atmosphere is argon gas.

19. The method of claim 18 in which the group II–group VI compound is one or more compounds of the group zinc telluride, zinc selenide, zinc sulfide, mercury selenide, mercury telluride, mercury sulfide, cadmium sulfide, cadmium telluride, cadmium selenide, magnesium telluride, and magnesium selenide.

20. The method of claim 17 in which the group II–group VI compound is zinc telluride.

21. The method of claim 17 in which the sputtering is reactive sputtering.

* * * * *

UNITED STATES PATENT AND TRADEMARK OFFICE
CERTIFICATE OF CORRECTION

PATENT NO. : 6,852,614 B1　　　　　　　　　　　　　　　　　　　　Page 1 of 1
DATED : February 8, 2005
INVENTOR(S) : Alvin D. Compaan et al.

It is certified that error appears in the above-identified patent and that said Letters Patent is hereby corrected as shown below:

<u>Title page,</u>
Item [73], Assignee, delete "University of Maine" and insert -- University of Toledo --

Signed and Sealed this

Second Day of August, 2005

JON W. DUDAS
*Director of the United States Patent and Trademark Office*